United States Patent
Tai et al.

(10) Patent No.: US 10,372,529 B2
(45) Date of Patent: Aug. 6, 2019

(54) ITERATIVE SOFT INFORMATION CORRECTION AND DECODING

(71) Applicant: SanDisk Enterprise IP LLC, Milpitas, CA (US)

(72) Inventors: Ying Yu Tai, Mountain View, CA (US); Seungjune Jeon, Santa Clara, CA (US); Jiangli Zhu, San Jose, CA (US)

(73) Assignee: Sandisk Technologies LLC, Plano, TX (US)

(*) Notice: Subject to any disclaimer, the term of this patent is extended or adjusted under 35 U.S.C. 154(b) by 231 days.

(21) Appl. No.: 14/973,603

(22) Filed: Dec. 17, 2015

(65) Prior Publication Data

US 2016/0306694 A1 Oct. 20, 2016

Related U.S. Application Data

(60) Provisional application No. 62/150,208, filed on Apr. 20, 2015.

(51) Int. Cl.
  G06F 11/10 (2006.01)
  H03M 13/29 (2006.01)
  (Continued)

(52) U.S. Cl.
  CPC ........ G06F 11/1012 (2013.01); G06F 11/108 (2013.01); H03M 13/2957 (2013.01);
  (Continued)

(58) Field of Classification Search
  CPC ........... G06F 11/1068; H03M 13/1102; H03M 13/2906; G11C 11/5642; G11C 2029/0411; G11C 29/52
  See application file for complete search history.

(56) References Cited

U.S. PATENT DOCUMENTS 4,586,167 A 4/1986 Fujishima et al.
5,559,988 A 9/1996 Durante et al.
(Continued)

FOREIGN PATENT DOCUMENTS

EP 0 376 285 A2 7/1990
WO WO 2012/083308 6/2012

OTHER PUBLICATIONS

Seagate Technology, "SCSI Commands Reference Manual, Rev. C", Product Manual dated Apr. 2010, pp. 211-214.
(Continued)

*Primary Examiner* — Kyle Vallecillo
(74) *Attorney, Agent, or Firm* — Morgan, Lewis & Bockius LLP

(57) ABSTRACT

A method is provided that includes performing first decoding operations on data obtained from a plurality of units of memory using soft information values for the plurality of units of memory, where the plurality of units of memory includes an error correction stripe. The method further includes determining that two or more units of memory have uncorrectable errors. The method further includes updating a soft information value for a first unit of memory in accordance with a magnitude of a soft information value for a second unit and a direction based on parity of the error correction stripe excluding the first unit, where the first unit of memory and the second unit of memory are included in the two or more units of memory that have uncorrectable errors. The method further includes performing a second decoding operation on data obtained from the first unit using the updated soft information value.

21 Claims, 8 Drawing Sheets

(51) Int. Cl.
  *H03M 13/11* (2006.01)
  *G11C 29/52* (2006.01)
  *H03M 13/00* (2006.01)
  *G11C 11/56* (2006.01)
  *G11C 29/04* (2006.01)

(52) U.S. Cl.
  CPC ..... *H03M 13/6325* (2013.01); *G11C 11/5642* (2013.01); *G11C 29/52* (2013.01); *G11C 2029/0411* (2013.01); *H03M 13/1111* (2013.01)

(56) References Cited

U.S. PATENT DOCUMENTS

| | | | |
|---|---|---|---|
| 5,909,559 | A | 6/1999 | So |
| 6,247,136 | B1 | 6/2001 | MacWilliams et al. |
| 6,292,410 | B1 | 9/2001 | Yi et al. |
| 6,401,213 | B1 | 6/2002 | Jeddeloh |
| 6,449,709 | B1 | 9/2002 | Gates |
| 6,952,682 | B1 | 10/2005 | Wellman |
| 7,969,809 | B2 | 6/2011 | Ben-Rubi |
| 8,010,738 | B1 | 8/2011 | Chilton et al. |
| 8,122,202 | B2 | 2/2012 | Gillingham |
| 8,213,255 | B2 | 7/2012 | Hemink et al. |
| 8,255,618 | B1 | 8/2012 | Borchers et al. |
| 8,321,627 | B1 | 11/2012 | Norrie et al. |
| 8,429,498 | B1 | 4/2013 | Anholt et al. |
| 8,479,080 | B1 | 7/2013 | Shalvi et al. |
| 8,539,139 | B1 | 9/2013 | Morris |
| 8,595,590 | B1 | 11/2013 | Vojcic et al. |
| 8,775,720 | B1 | 7/2014 | Meyer et al. |
| 8,825,967 | B2 | 9/2014 | Hong Beom |
| 8,874,836 | B1 | 10/2014 | Hayes et al. |
| 8,886,872 | B1 | 11/2014 | Norrie |
| 8,924,661 | B1 | 12/2014 | Shachar et al. |
| 8,984,376 | B1* | 3/2015 | Norrie ................ H03M 13/114 714/772 |
| 9,128,825 | B1 | 9/2015 | Albrecht et al. |
| 9,170,876 | B1* | 10/2015 | Bates ................ G06F 11/1048 |
| 9,176,971 | B2* | 11/2015 | Shapiro .................... G06F 8/61 |
| 9,214,965 | B2* | 12/2015 | Fitzpatrick .......... G06F 11/1012 |
| 9,606,737 | B2 | 3/2017 | Kankani et al. |
| 9,639,282 | B2 | 5/2017 | Kankani et al. |
| 2003/0115403 | A1 | 6/2003 | Bouchard et al. |
| 2003/0122834 | A1 | 7/2003 | Mastronarde et al. |
| 2004/0117441 | A1 | 6/2004 | Liu et al. |
| 2005/0144361 | A1 | 6/2005 | Gonzalez et al. |
| 2005/0248992 | A1 | 11/2005 | Hwang et al. |
| 2007/0002629 | A1 | 1/2007 | Lee et al. |
| 2007/0156998 | A1 | 7/2007 | Gorobets |
| 2007/0233937 | A1 | 10/2007 | Coulson et al. |
| 2008/0140914 | A1 | 6/2008 | Jeon |
| 2008/0147994 | A1 | 6/2008 | Jeong et al. |
| 2008/0235466 | A1 | 9/2008 | Traister |
| 2008/0235480 | A1 | 9/2008 | Traister |
| 2008/0291204 | A1 | 11/2008 | Korupolu et al. |
| 2008/0295094 | A1 | 11/2008 | Korupolu et al. |
| 2009/0168525 | A1 | 7/2009 | Olbrich et al. |
| 2009/0177943 | A1* | 7/2009 | Silvus ................ G11B 20/1496 714/755 |
| 2009/0222627 | A1 | 9/2009 | Reid |
| 2009/0282191 | A1 | 11/2009 | Depta |
| 2010/0005217 | A1 | 1/2010 | Jeddeloh |
| 2010/0014364 | A1 | 1/2010 | Laberge et al. |
| 2010/0082879 | A1 | 4/2010 | McKean et al. |
| 2010/0165730 | A1 | 7/2010 | Sommer et al. |
| 2010/0174845 | A1 | 7/2010 | Gorobets et al. |
| 2010/0174853 | A1 | 7/2010 | Lee et al. |
| 2010/0220509 | A1 | 9/2010 | Solokov et al. |
| 2010/0250874 | A1 | 9/2010 | Farrell et al. |
| 2011/0113204 | A1 | 5/2011 | Henriksson et al. |
| 2011/0138100 | A1 | 6/2011 | Sinclair |
| 2011/0235434 | A1 | 9/2011 | Byom et al. |
| 2011/0252215 | A1 | 10/2011 | Franceschini et al. |
| 2011/0264851 | A1 | 10/2011 | Jeon et al. |
| 2011/0302474 | A1 | 12/2011 | Goss et al. |
| 2012/0030408 | A1 | 2/2012 | Flynn et al. |
| 2012/0047317 | A1 | 2/2012 | Yoon et al. |
| 2012/0159070 | A1 | 6/2012 | Baderdinni et al. |
| 2012/0198129 | A1 | 8/2012 | Van Aken et al. |
| 2012/0224425 | A1 | 9/2012 | Fai et al. |
| 2012/0278530 | A1 | 11/2012 | Ebsen |
| 2012/0324180 | A1 | 12/2012 | Asnaashari et al. |
| 2013/0007380 | A1 | 1/2013 | Seekins et al. |
| 2013/0070507 | A1 | 3/2013 | Yoon |
| 2013/0111112 | A1 | 5/2013 | Jeong et al. |
| 2013/0111289 | A1* | 5/2013 | Zhang ................ H03M 13/1108 714/752 |
| 2013/0111290 | A1* | 5/2013 | Zhang ................ H03M 13/1108 714/752 |
| 2013/0132650 | A1 | 5/2013 | Choi et al. |
| 2013/0182506 | A1 | 7/2013 | Melik-Martirosian |
| 2013/0219106 | A1 | 8/2013 | Vogan et al. |
| 2013/0232290 | A1 | 9/2013 | Ish et al. |
| 2013/0254498 | A1 | 9/2013 | Adachi et al. |
| 2013/0262745 | A1 | 10/2013 | Lin et al. |
| 2013/0297894 | A1 | 11/2013 | Cohen et al. |
| 2013/0346805 | A1 | 12/2013 | Sprouse et al. |
| 2014/0006688 | A1 | 1/2014 | Yu et al. |
| 2014/0013026 | A1 | 1/2014 | Venkata et al. |
| 2014/0047170 | A1 | 2/2014 | Cohen et al. |
| 2014/0075100 | A1 | 3/2014 | Kaneko et al. |
| 2014/0143637 | A1* | 5/2014 | Cohen ................ H03M 13/1108 714/773 |
| 2014/0148175 | A1 | 5/2014 | Luo |
| 2014/0173239 | A1 | 6/2014 | Schushan |
| 2014/0229655 | A1 | 8/2014 | Goss et al. |
| 2014/0229656 | A1 | 8/2014 | Goss et al. |
| 2014/0241071 | A1 | 8/2014 | Goss et al. |
| 2014/0244897 | A1 | 8/2014 | Goss et al. |
| 2014/0244899 | A1 | 8/2014 | Schmier et al. |
| 2014/0258598 | A1 | 9/2014 | Canepa et al. |
| 2014/0281833 | A1 | 9/2014 | Kroeger et al. |
| 2014/0310241 | A1 | 10/2014 | Goyen |
| 2014/0379988 | A1 | 12/2014 | Lyakhovitskiy et al. |
| 2015/0067172 | A1 | 3/2015 | Ashokan et al. |
| 2015/0074487 | A1 | 3/2015 | Patapoutian et al. |
| 2015/0095558 | A1 | 4/2015 | Kim et al. |
| 2015/0113206 | A1 | 4/2015 | Fitzpatrick et al. |
| 2015/0186278 | A1 | 7/2015 | Jayakumar et al. |
| 2015/0234612 | A1 | 8/2015 | Himelstein et al. |
| 2015/0261473 | A1 | 9/2015 | Matsuyama et al. |
| 2015/0262632 | A1 | 9/2015 | Shelton et al. |
| 2015/0301749 | A1 | 10/2015 | Seo et al. |
| 2015/0331627 | A1 | 11/2015 | Kwak |
| 2016/0026386 | A1 | 1/2016 | Ellis et al. |
| 2016/0034194 | A1 | 2/2016 | Brokhman et al. |
| 2016/0062699 | A1 | 3/2016 | Samuels et al. |
| 2016/0070493 | A1 | 3/2016 | Oh et al. |
| 2016/0071612 | A1 | 3/2016 | Takizawa et al. |
| 2016/0117099 | A1 | 4/2016 | Prins et al. |
| 2016/0117102 | A1 | 4/2016 | Hong et al. |
| 2016/0117105 | A1 | 4/2016 | Thangaraj et al. |
| 2016/0117252 | A1 | 4/2016 | Thangaraj et al. |
| 2016/0170671 | A1 | 6/2016 | Huang |
| 2016/0170831 | A1 | 6/2016 | Lesatre et al. |
| 2016/0179403 | A1 | 6/2016 | Kurotsuchi et al. |
| 2016/0210060 | A1 | 7/2016 | Dreyer |
| 2016/0299689 | A1 | 10/2016 | Kim et al. |
| 2016/0299699 | A1 | 10/2016 | Vanaraj et al. |
| 2016/0299704 | A1 | 10/2016 | Vanaraj et al. |
| 2016/0299724 | A1 | 10/2016 | Vanaraj et al. |
| 2016/0342344 | A1 | 11/2016 | Kankani et al. |
| 2016/0342345 | A1 | 11/2016 | Kankani et al. |
| 2016/0371394 | A1 | 12/2016 | Shahidi et al. |

OTHER PUBLICATIONS

Tanenbaum, "Structured Computer Organization", 3rd edition 1990, section 1.4, p. 11, 3 pages.

International Search Report and Written Opinion dated Nov. 18, 2015, received in International Patent Application No. PCT/US2015/039552 which corresponds to U.S. Appl. No. 14/559,183, 11 pages (Ellis).

(56) References Cited

OTHER PUBLICATIONS

International Search Report and Written Opinion dated Jul. 4, 2016, received in International Patent Application No. PCT/US2016/028477, which corresponds to U.S. Appl. No. 14/883,540, 11 pages (Hodgdon).
International Search Report and Written Opinion dated Nov. 9, 2015, received in International Patent Application No. PCT/US2015/053551, which corresponds to U.S. Appl. No. 14/668,690, 12 pages (Thangaraj).
International Search Report and Written Opinion dated Nov. 11, 2015, received in International Patent Application No. PCT/US2015/053582, which corresponds to U.S. Appl. No. 14/659,493, 12 pages (Prins).
International Search Report and Written Opinion dated Sep. 8, 2016, received in International Patent Application No. PCT/US2016/036716, which corresponds to U.S. Appl. No. 14/925,945, 13 pages (Ellis).
International Preliminary Report on Patentability dated May 2, 2017, received in International Patent Application No. PCT/US2015/053551, which corresponds to U.S. Appl. No. 14/668,690, 8 pages (Thangaraj).
International Preliminary Report on Patentability dated May 2, 2017, received in International Patent Application No. PCT/US2015/053582, which corresponds to U.S. Appl. No. 14/659,493, 7 pages (Prins).
Atmel Data-sheet, "9-to-bit Selectable, ±0.5° C Accurate Digital Temperature Sensor with Nonvolatile Registers and Serial EEPROM" www.atmel.com/images/Atmel-8854-DTS-AT30TSE752A-754A-758A-Datasheet.pdf, Atmel Data-sheet, Mar. 1, 2011,—Atmel-8854-DTS-AT30TSE752A-754A-758A-Datasheet_102014, 57 pages.

* cited by examiner

400

┌─────────────────────────────────────────────────────────────┐
│ Perform first decoding operations on data obtained from a plurality of units of │ ─502
│ memory using soft information values for the plurality of units of memory. The │
│ plurality of units of memory includes an error correction stripe. │
│                                                             │
│ ┌─────────────────────────────────────────────────────────┐ │
│ │ The units of memory comprise one of partial pages, pages, codewords, │ ─504
│ │       partial codewords, blocks, and die planes         │ │
│ └─────────────────────────────────────────────────────────┘ │
│                                                             │
│ ┌─────────────────────────────────────────────────────────┐ │
│ │       The units of memory comprise non-volatile memory      │ ─506
│ └─────────────────────────────────────────────────────────┘ │
│                                                             │
│ ┌─────────────────────────────────────────────────────────┐ │
│ │         The units of memory comprise flash memory           │ ─508
│ └─────────────────────────────────────────────────────────┘ │
└─────────────────────────────────────────────────────────────┘
                              │
                              ▼
┌─────────────────────────────────────────────────────────────┐
│ Determine that two or more of the plurality of units of memory have │
│ uncorrectable errors. The uncorrectable errors are uncorrectable using the first │ ─510
│                      decoding operations.                   │
└─────────────────────────────────────────────────────────────┘
                              │
                              ▼
┌─────────────────────────────────────────────────────────────┐
│ Update a respective soft information value for a first unit of memory in │
│                         accordance with:                    │
│                                                             │
│ A magnitude of a corresponding soft information value for a second unit of │
│                             memory; and                     │
│                                                             │
│ A direction based on parity of the error correction stripe excluding the first unit │ ─512
│                            of memory.                       │
│                                                             │
│ The first unit of memory and the second unit of memory are included in the │
│     two or more units of memory that have uncorrectable errors. │
│                                                             │
│ ┌─────────────────────────────────────────────────────────┐ │
│ │ The error correction stripe includes a parity unit that stores a parity value │ ─514
│ │       based on at least the first unit and the second unit  │ │
│ │ ┌─────────────────────────────────────────────────────┐ │ │
│ │ │      The error correction stripe is a RAID stripe     │ │ ─516
│ │ └─────────────────────────────────────────────────────┘ │ │
│ └─────────────────────────────────────────────────────────┘ │
│                                                             │
│ ┌─────────────────────────────────────────────────────────┐ │
│ │   The soft information values comprise log-likelihood ratios (LLRs)   │ ─518
│ └─────────────────────────────────────────────────────────┘ │
└─────────────────────────────────────────────────────────────┘
                              Ⓐ

ITERATIVE SOFT INFORMATION CORRECTION AND DECODING

RELATED APPLICATIONS

This application claims priority to U.S. Provisional Patent Application No. 62/150,208, filed Apr. 20, 2015, which is hereby incorporated by reference in its entirety.

FIELD OF THE DISCLOSURE

The embodiments described herein relate generally to the field of data storage, and in particular to data storage applications using solid state nonvolatile memory devices.

BACKGROUND OF THE INVENTION

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data memory device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

One problem with flash memory is data loss that occurs as the result of various factors affecting flash memory. Such error-inducing factors include pseudo-random electrical fluctuations, defects in the storage medium, operating conditions, memory cell history (e.g., a count of the number of program-erase (P/E) cycles performed on the memory cell), suboptimal performance or design and/or degradation of write-read circuitry, or a combination of these and other factors.

In the embodiments described below, an improved method for protecting data and recovering erroneous data stored in non-volatile memory devices is provided.

SUMMARY OF THE DISCLOSURE

Without limiting the scope of the appended claims, after considering this disclosure, and particularly after considering the section entitled "Detailed Description" one will understand how the aspects of various embodiments are implemented and used to adjust soft information values for data stored on a storage device. In one aspect, when first decoding operations on a plurality of units of memory yield at least two units of memory with uncorrectable errors, a soft information value for a first uncorrectable unit of memory is updated in accordance with a soft information value for a second uncorrectable unit of memory. A second decoding operation is then performed in another attempt to decode the first uncorrectable unit of memory.

BRIEF DESCRIPTION OF THE DRAWINGS

So that the present disclosure can be understood in greater detail, a more particular description is made with reference to the features of various implementations, some of which are illustrated in the appended drawings. The appended drawings, however, merely illustrate the more pertinent features of the present disclosure and are therefore not to be considered limiting.

FIGS. 5A-5D illustrate a flowchart of a method of updating soft information values for decoding data, in accordance with some embodiments.

Figure 1:
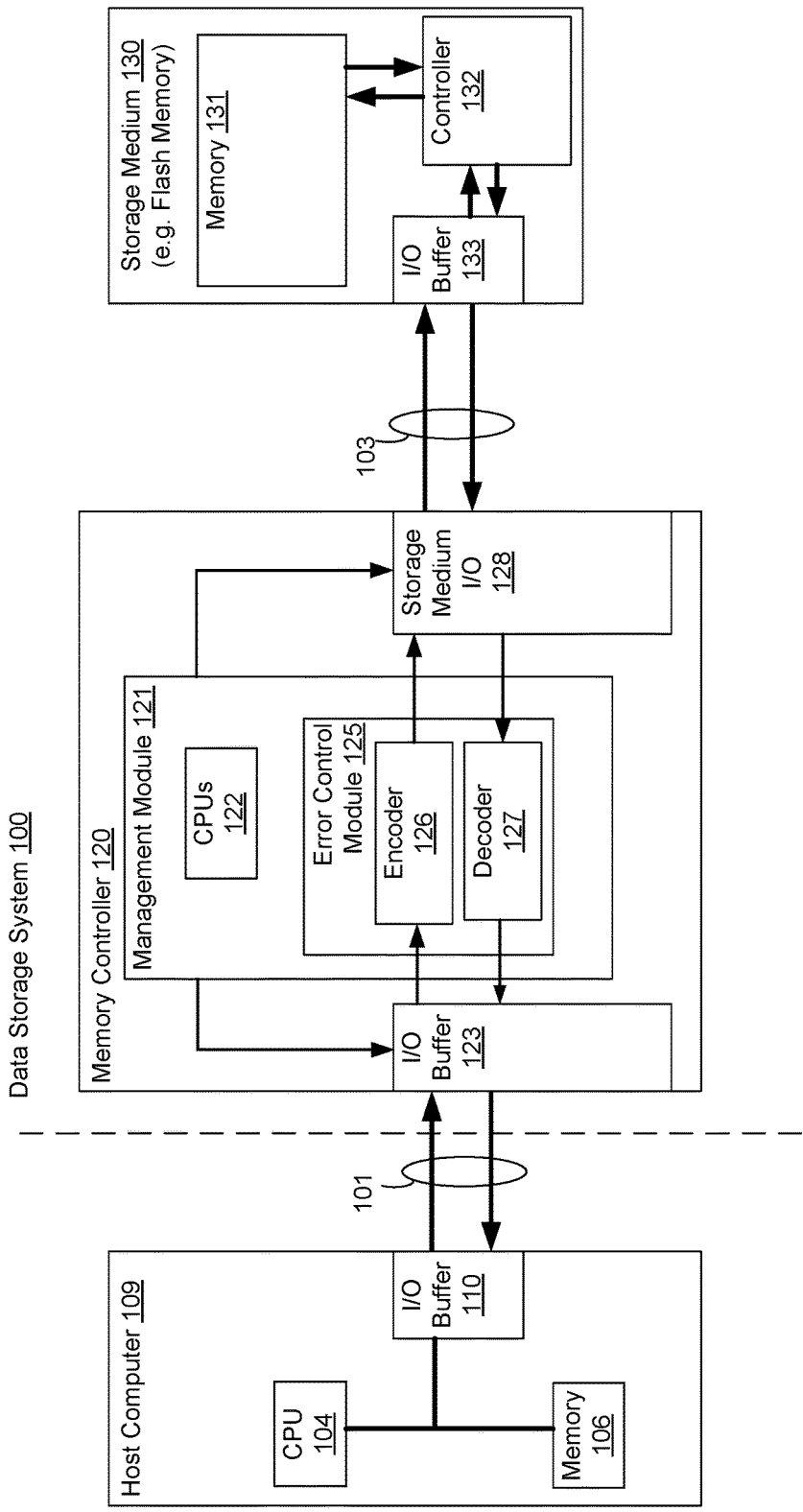
FIG. 1 is a schematic diagram of a data storage environment, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

The various embodiments described herein include methods, computer readable storage media and/or systems used to update soft information values used in error correction codes (ECCs) for decoding.

Data is often stored in an encoded form within a unit of memory. For example, in some circumstances, LDPC (low density parity check) encoded data is stored as a sequence of bits in a codeword in memory. When a data request is received for data in the codeword, a sequence of soft information values is generated for the codeword (e.g., one soft information value per bit in the codeword).

Using the sequence of soft information values for the LDPC encoded data, a memory controller attempts to decode the LDPC encoded data. Accordingly, LDPC is referred to herein as a primary encoding/decoding. Such decoding is possible within certain limits on the amount of error in the set of soft information values, beyond which the data is said to be uncorrectable using the primary decoding (e.g., LDPC). When data is uncorrectable using primary decoding, in some embodiments, the memory controller attempts to perform a remedial decoding, for example, by exclusive ORing (XORing) other data in a RAID stripe to recover the data that could not be decoded using the primary decoding. Such remedial decoding will often involve decoding additional data using the primary decoding. For example, the memory controller will attempt to decode all of the data included in or contributing to an error correction stripe (e.g., a RAID stripe). When the additional data are successfully decoded, the uncorrectable data is recoverable using the remedial decoding (e.g., by bit-wise XORing the remaining data together). But when portions of the additional data in the error correction stripe are uncorrectable, the remedial decoding may be unavailable as well.

Some embodiments of the present disclosure include a method of updating soft information values, e.g., used by an LDPC error encoding and recovery methodology, in order to give the memory controller another opportunity to decode uncorrectable data using the primary decoding. The method can recover data that would otherwise be lost due to a large number of errors, e.g., random retention errors associated with a storage medium having one or more die nearing the end of their useful life, and random read disturb errors associated with a storage medium having been intensively read internally or by a host system. Further, following successful decoding of data using the primary decoding with updated soft information values, the method can be bootstrapped and/or combined with the remedial decoding to recover additional otherwise uncorrectable data in the error correction stripe.

(A1) More specifically, some embodiments include a method of decoding data stored in memory. In some embodiments, the method includes performing first decoding operations on data obtained from a plurality of units of memory using soft information values for the plurality of units of memory. The plurality of units of memory includes an error correction stripe. The method further includes determining that two or more of the plurality of units of memory have uncorrectable errors, where the uncorrectable errors are uncorrectable using the first decoding operations. The method further includes updating a respective soft information value for a first unit of memory in accordance with a magnitude of a corresponding soft information value for a second unit of memory and a direction based on parity of the error correction stripe excluding the first unit of memory, where the first unit of memory and the second unit of memory are included in the two or more units of memory that have uncorrectable errors. The method further includes performing a second decoding operation on data obtained from at least a portion of the first unit of memory using the updated soft information value.

(A2) In some embodiments of the method in A1, in accordance with a determination that the second decoding operation is successful, the method further includes generating corrected data values for the second unit using decoded data for the first unit of memory produced by the second decoding operation.

(A3) In some embodiments of the method in A1 or A2, the method further includes, in accordance with a determination that the second decoding operation is unsuccessful, performing a set of remedial operations. The set of remedial operations includes updating a respective soft information value for the second unit of memory, corresponding to uncorrectable errors in the second unit of memory, in accordance with a magnitude of a corresponding soft information value for the first unit and a direction based on parity of the error correction stripe excluding the second unit of memory. The set of remedial operations further includes performing a third decoding operation on data obtained from at least a portion of the second unit of memory using the updated soft information value for the second unit of memory and, in accordance with a determination that the third decoding operation is successful, generating corrected data values for the first unit of memory using decoded data for the second unit of memory produced by the third decoding operation.

(A4) In some embodiments of the method in A1 or A2, the method further includes, in accordance with a determination that the second decoding operation is unsuccessful, performing a set of remedial operations. The set of remedial operations includes further updating a respective soft information value for the first unit of memory, corresponding to uncorrectable errors in the first unit of memory, in accordance with a magnitude of a corresponding soft information value for a third unit of the two or more units of memory that include uncorrectable errors and a direction based on parity of the error correction stripe excluding the first unit of memory. The set of remedial operations further includes performing a further decoding operation on data obtained from at least a portion of the first unit of memory using the updated soft information value.

(A5) In some embodiments of the method in any of A1-A4, the error correction stripe includes a parity unit that stores one or more parity values based on at least data in the first unit of memory and the second unit of memory.

(A6) In some embodiments of the method in A5, the error correction stripe is a RAID stripe.

(A7) In some embodiments of the method in any of A1-A6, the soft information values comprise log-likelihood ratios (LLRs).

(A8) In some embodiments of the method in any of A1-A7, the units of memory comprise one of partial pages, pages, codewords, partial codewords, blocks, and die planes.

(A9) In some embodiments of the method in any of A1-A8, the units of memory comprise non-volatile memory.

(A10) In some embodiments of the method in any of A1-A9, the units of memory comprise flash memory.

(A11) In some embodiments of the method in any of A1-A10, the first decoding operations and the second decoding operation comprise low-density parity check (LDPC) decoding operations.

(A12) In some embodiments of the method in A11, updating the respective soft information value for the first unit of memory comprises calculating, as the updated soft information value, a linear combination of the respective soft information value and an update term calculated in accordance with the magnitude of the corresponding soft information value for the second unit of memory and the direction based on parity of the error correction stripe excluding the first unit of memory.

(A13) In another aspect, a storage device that decodes data stored in non-volatile memory includes the non-volatile memory, one or more processors, a decoder, and controller memory. The decoder is for decoding data obtained from the non-volatile memory, including data obtained from a plurality of units of the non-volatile memory using soft information values for the plurality of units of the non-volatile memory, where the plurality of units of the non-volatile memory includes an error correction stripe. The controller memory stores one or more programs, which when executed by the one or more processors cause the storage device to perform a set of operations. The set of operations includes determining that two or more of the plurality of units of the non-volatile memory have uncorrectable errors, where the uncorrectable errors are uncorrectable using the first decoding operations. The set of operations further includes updating a respective soft information value for a first unit of memory in accordance with a magnitude of a corresponding soft information value for a second unit of memory and a direction based on parity of the error correction stripe excluding the first unit of memory, where the first unit of memory and the second unit of memory are included in the two or more units of memory that have uncorrectable errors. The decoder is further for decoding data obtained from at least a portion of the first unit of memory using the updated soft information value.

(A14) In some embodiments of the storage device of A13, the storage device is configured to operate in accordance with any of the methods described herein.

(A15) In another aspect, a non-transitory computer readable storage medium stores one or more programs configured for execution by one or more processors of a storage system. The one or more programs include instructions for performing first decoding operations on a plurality of units of memory using soft information values for the plurality of units of memory, where the plurality of units of memory includes an error correction stripe. The one or more programs further include instructions for determining that two or more of the plurality of units of memory have uncorrectable errors, where the uncorrectable errors are uncorrectable using the first decoding operations. The one or more programs further include instructions updating a respective soft information value for a first unit of memory in accordance with a magnitude of a corresponding soft information value for a second unit of memory and a direction based on parity of the error correction stripe excluding the first unit of memory, where the first unit of memory and the second unit of memory are included in the two or more units of memory that have uncorrectable errors. The one or more programs further include instructions performing a second decoding operation on data obtained from at least a portion of the first unit of memory using the updated soft information value.

(A16) In some embodiments of the non-transitory computer readable storage medium in A15, the one or more programs include instructions for performing any of the methods described herein.

Below, FIGS. 1-4 illustrate aspects of exemplary memory devices for use in implementing the method described with reference to FIGS. 5A-5D.

FIG. 1 is a block diagram illustrating an implementation of a data storage system 100 used in conjunction with computer system 109, in accordance with some embodiments. While certain specific features are illustrated, those skilled in the art will appreciate from the present disclosure that various other features have not been illustrated for the sake of brevity so as not to obscure more pertinent aspects of the example implementations disclosed herein. To that end, as a non-limiting example, data storage system 100 includes memory controller 120 and storage medium 130 (e.g., a flash memory device).

Computer system 109 is coupled to memory controller 120 through I/O buffer 110 and data connections 101. Those skilled in the art will appreciate from the present disclosure that, in some implementations, computer system 109 includes memory controller 120 as a component. Generally, computer system 109 includes any suitable computer device, such as a computer server, a desktop computer, a laptop computer, a tablet device, a netbook, an internet kiosk, a personal digital assistant, a mobile phone, a smart phone, a gaming device, or any other computing device. Computer system 109 is sometimes called a host, host system, client, or client system. In some embodiments, computer system 109 is a server system, such as a server system in a data center. In some embodiments, computer system 109 includes one or more processors 104 (sometimes called central processing units, CPUs, processing units, or the like), one or more types of memory (represented by memory 106 in FIG. 1), a display and/or other user interface components such as a keyboard, a touch screen display, a mouse, a track-pad, a digital camera and/or any number of supplemental devices to add functionality.

Storage medium 130 is coupled to memory controller 120 through connections 103 and I/O buffer 133. Connections 103 are sometimes called data connections, but typically convey commands in addition to data, and optionally convey metadata, error correction information and/or other information in addition to data values to be stored in storage medium 130 and data values read from storage medium 130. In some embodiments, however, memory controller 120 and storage medium 130 are included in the same device (e.g., an integrated device) as components thereof. Furthermore, in some embodiments, memory controller 120 and storage medium 130 are embedded in a host device (e.g., computer system 109), such as a mobile device, tablet, other computer or computer controlled device, and the methods described herein are performed, at least in part, by the embedded storage controller. Storage medium 130 includes any number (i.e., one or more) of memory devices including, without limitation, non-volatile semiconductor memory devices (e.g., memory 131), such as flash memory. Storage medium 130 also optionally includes a low-level memory controller 132. For example, flash memory devices can be configured for enterprise storage suitable for applications such as cloud computing, database applications, secondary storage, or for caching data stored (or to be stored) in secondary storage, such as hard disk drives. Additionally and/or alternatively, flash memory devices can also be configured for relatively smaller-scale applications such as personal flash drives or hard-disk replacements for personal, laptop and tablet computers. In some implementations, storage medium 130 comprises one or more flash memory devices. In some implementations, storage medium 130 comprises at least one of NAND-type flash memory and NOR-type flash memory.

Memory 131 is divided into a number of addressable and individually selectable blocks. In some embodiment, the individually selectable blocks are the minimum size erasable units in a flash memory device. In other words, each block contains the minimum number of memory cells that can be erased without erasing any other memory cells in the same flash memory device. Typically, when a flash memory block is erased, all memory cells in the block are erased simultaneously. Each block is usually further divided into a plurality of pages and/or word lines, where each page or word line is typically an instance of the smallest individually accessible (writable or readable) portion of a block. In some embodiments, however, (e.g., using some types of flash memory) the minimum unit of accessible data is a sector, which is a sub-unit of a page. That is, a block includes multiple pages, each page contains a plurality of sectors, and each sector is the minimum unit of data for data writing or reading to the flash memory device.

In some embodiments, a page includes a plurality of units of memory. The units of memory store data elements or check words (e.g., parity words) or a combination thereof. In some embodiments, each of the data elements is (or includes) a codeword that has both data and parity elements (e.g., bits). In some embodiments, codewords are individually protected data elements (e.g., the codewords are encoded using BCH or LDPC during write operations, and are decoded during read operations). For ease of explanation, embodiments are hereinafter described with reference to "codewords." In some embodiments, only one "codeword" is stored in each page, but in other embodiments multiple codewords are stored in a page, and furthermore multiple pages are stored in a word line. Those skilled in the art will recognize that the systems, methods, and devices described herein can be generalized to more generic data elements.

In some embodiments, a block of data includes a number of pages, and each page includes either a number of codewords or a number of check words. For purposes of this disclosure, check words each have the same size as codewords (or, alternatively, data elements), but are not codewords (or data elements). For example, in some implementations, one block includes 64 pages, 128 pages, 256 pages, or another suitable number of pages. The respective sizes of blocks, pages and codewords are often a matter of design choice, and often differ across a wide range of enterprise and consumer devices. In another example, and without limitation, in some applications a codeword includes anywhere from 256 bytes to 544 bytes. That range may be extended upward or downward, and/or shrink or expand depending on a particular application.

In some implementations, memory controller 120 includes management module 121, I/O buffer 123, storage medium I/O 128. Those skilled in the art will appreciate from the present disclosure that memory controller 120 includes various additional features that have not been illustrated for the sake of brevity, and so as not to obscure more pertinent features of the example implementations disclosed herein, and that a different arrangement of features may be possible.

Input and output buffers 123, sometimes called a host interface, provides an interface to host system 109 through data connections 101. Similarly, storage medium I/O 128 provides an interface to storage medium 130 through data connections 103. In some implementations, storage medium I/O 128 includes read and write circuitry.

In some implementations, management module 121 includes a processor 122 configured to execute instructions in one or more programs, e.g., programs stored in controller memory in management module 121, and error control module 125. However, those skilled in the art will appreciate from the present disclosure that, in some implementations, processor 122 is shared by one or more components within, and in some cases, beyond the function of memory controller 120. Management module 121 includes or is coupled to input and output buffers 123, error control module 125 and storage medium I/O 128 in order to coordinate the operation of these components.

In some embodiments, error control module 125 includes an encoder 126 and a decoder 127. In some embodiments, encoder 126 encodes data by applying an error control code to produce a codeword, which is subsequently stored in storage medium 130. When encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

In some embodiments, during a write operation, I/O buffer 123 receives data to be stored in storage medium 130 from computer system 109. The data received by I/O buffer 123 are made available to encoder 126, which encodes the data to produce one or more codewords. The one or more codewords are made available to storage medium I/O 128, which transfers the one or more codewords to storage medium 130 in a manner dependent on the type of storage medium being utilized.

In some embodiments, a read operation is initiated when computer system (host) 109 sends one or more host read commands (e.g., via data connections 101, or alternatively a separate control line or bus) to memory controller 120 requesting data from storage medium 130. Memory controller 120 sends one or more read access commands to storage medium 130, via storage medium I/O 128, to obtain raw read data and/or soft information values in accordance with memory locations (addresses) specified by the one or more host read commands. Storage medium I/O 128 provides the raw read data (e.g., comprising one or more codewords) to decoder 127. If the decoding is successful, the decoded data is provided to host interface 129, where the decoded data is made available to computer system 109. In some embodiments, if the decoding is not successful, memory controller 120 may resort to a number of remedial actions as described below (e.g., with reference to method 500) or provide an indication of an irresolvable error condition.

Figure 2:
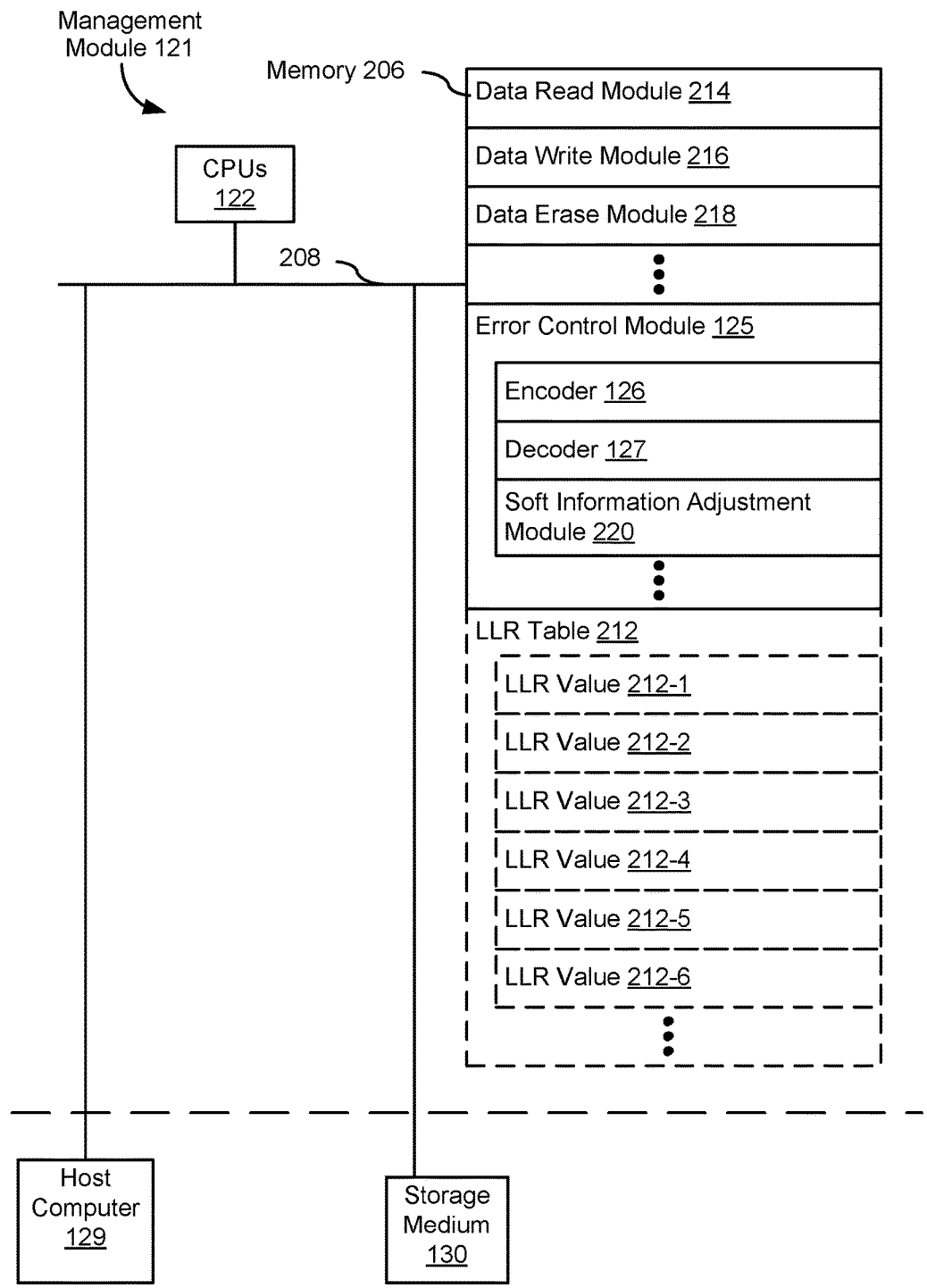
FIG. 2 illustrates an exemplary organization of a memory controller, in accordance with some embodiments.
Figure 3:
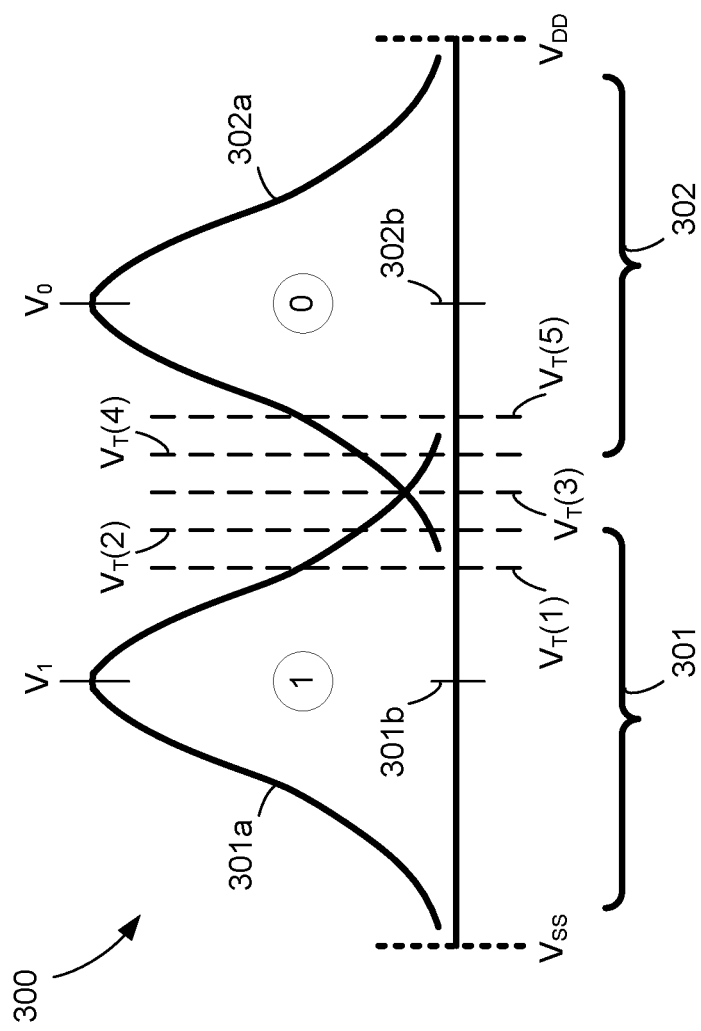
FIG. 3 illustrates a simplified, prophetic diagram of voltage distributions that are found in a single-level (SLC) flash memory cell, in accordance with some embodiments.

FIG. 2 is a block diagram illustrating a management module 121, in accordance with some embodiments, as shown in FIG. 1. Management module 121 typically includes one or more processing units (sometimes called CPUs or processors) 122 for executing modules, programs and/or instructions stored in memory 206 and thereby performing processing operations, memory 206 (sometimes called controller memory), and one or more communication buses 208 for interconnecting these components. The one or more communication buses 208 optionally include circuitry (sometimes called a chipset) that interconnects and controls communications between system components. Management module 121 is coupled to host interface 129, and storage medium I/O 128 by the one or more communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the CPU(s) 122. Memory 206, or alternatively the non-volatile memory device(s) within memory 206, comprises a non-transitory computer readable storage medium. In some embodiments, memory 206, or the non-transitory computer readable storage medium of memory 206 stores the following programs, modules, and data structures, or a subset or superset thereof:

- data read module 214, which is used for reading data (e.g., together with decoder 127) from one or more codewords, pages or blocks in a storage medium (e.g., storage medium 130, FIG. 1);
- data write module 216, which is used for writing data (e.g., together with encoder 126) to one or more codewords, pages or blocks in a storage medium (e.g., storage medium 130, FIG. 1);
- data erase module 218, which is used for erasing data from one or more blocks in a storage medium (e.g., storage medium 130, FIG. 1);
- error control module 125, including:
  - encoder 126, which receives data (e.g., from data write module 216), performs encoding operations, and passes the encoded data to a storage medium (e.g., storage medium 130, FIG. 1);
  - decoder 127, which receives encoded data (e.g., storage medium 130, FIG. 1), performs decoding operations, and passes the data toward downstream elements (e.g., data read module 214);
  - soft information adjustment module 220, which adjusts soft information values (e.g., in accordance with method 500, FIGS. 5A-5D) when decoder 127 fails to decode data; and optional LLR table 212, which is a look-up table containing LLR values (e.g., LLR value 212-1 through LLR value 212-6) for various read parameters, as described in greater detail with reference to FIG. 3.

In some embodiments, encoder 126 is implemented in whole or in part in hardware, and includes a state machine that controls execution of a sequence of operations by encoder 126 when encoding data to form a codeword. Similarly, in some embodiments, decoder 127 is implemented in whole or in part in hardware, and includes a state machine that controls execution of a sequence of operations by decoder 127 when decoding a codeword to produce a set of decoded data.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the non-transitory computer readable storage medium of memory 206, provide instructions for implementing some of the methods described below. In some embodiments, some or all of these modules may be implemented with specialized hardware circuits that subsume part or all of the module functionality.

Although FIG. 2 shows management module 121 in accordance with some embodiments, FIG. 2 is intended more as a functional description of the various features that may be present in management module 121 than as a structural schematic of the embodiments described herein. In practice, and as recognized by those of ordinary skill in the art, the programs, modules, and data structures shown separately could be combined and some programs, modules, and data structures could be separated.

The terms "cell voltage" and "memory cell voltage," in the context of flash memory cells, mean the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1" and otherwise the raw data value is a "0."

FIG. 3 is a simplified, prophetic diagram of voltage distributions 300 that may be found in a single-level (SLC) flash memory cell. FIG. 3 is intended to facilitate discussion of how soft information values are generated from a read operation, in accordance with some embodiments. While FIG. 3 illustrates a simple way to generate an initial soft information value, many modifications are envisioned and intended to fall within the scope of the appended claims. For example, in some embodiments, a datum's initial soft information value is affected by the temperature, location, and/or history of the memory cell storing said datum.

One strategy used to characterize and/or read a data value stored in a memory location is to read the data from the memory location multiple times, using a plurality of distinct read threshold voltages (sometimes herein called read voltages or read signals) distributed across the transition or overlap between adjacent voltage ranges in the memory cell. In some embodiments, a soft information value (e.g., an LLR) is generated for the data value. In relation to method 500 (FIGS. 5A-5D), this soft information value is an example of an initial or pre-update soft information value, which may be subsequently updated in accordance with method 500.

For example, FIG. 3 is illustrates a sequence of read threshold voltages $V_T(1)$, $V_T(2)$, $V_T(3)$, $V_T(4)$, $V_T(5)$ that are applied to the SLC during a sequential set of read operations according to some implementations. Those skilled in the art will appreciate from the present disclosure that the voltage distributions 300 have been simplified for illustrative purposes. In this example, the SLC memory cell voltage range approximately extends from a voltage, $V_{SS}$, at the source terminal of a NMOS transistor to a voltage, $V_{DD}$, at the drain terminal of the same NMOS transistor. As such, voltage distributions 300 extend between $V_{SS}$ and $V_{DD}$.

Sequential voltage ranges 301, 302 between the source and drain voltages, $V_{SS}$ and $V_{DD}$, are used to represent corresponding bit values "1" and "0," respectively. Each voltage range 301 and 302 has a respective center voltage $V_1$ 301b and $V_0$ 302b. Each voltage range 301 and 302 also has a respective distribution of voltages 301a and 302a that may occur as a result of any number of a combination of error-inducing factors, examples of which are identified above.

Preferably, during a write operation, to write a respective desired bit value to a SLC flash memory cell the charge on the floating gate of the SLC flash memory cell is set such that the resultant cell voltage (i.e., the cell's resultant threshold voltage) is at the center of one of the ranges 301, 302. In other words, the resultant cell voltage is, ideally, set to one of $V_1$ 301b and $V_0$ 302b in order to write a respective one of the bit values "1" and "0." Under typical operating conditions, however, due in part to the error-inducing factors described above, the actual cell voltage may differ from the center voltage for the data written to the SLC flash memory cell.

In some implementations, read threshold voltages $V_T(1)$, $V_T(2)$, $V_T(3)$, $V_T(4)$, $V_T(5)$ are voltages located between adjacent center voltages $V_1$ 301b and $V_0$ 302b, e.g., applied proximate to the halfway region between adjacent center voltages $V_1$ 301b and $V_0$ 302b. Optionally, in some implementations, some or all of the read threshold voltages are located between voltage ranges 301, 302. In some implementations, read threshold voltages $V_T(1)$, $V_T(2)$, $V_T(3)$, $V_T(4)$, $V_T(5)$ are in the region proximate to where the voltage distributions 301a, 302a overlap (or within said region), which is not necessarily proximate to the halfway region between adjacent center voltages $V_1$ 301b and $V_0$ 302b. In some implementations, during a sequence of read operations, read threshold voltages $V_T(1)$, $V_T(2)$, $V_T(3)$, $V_T(4)$, $V_T(5)$ are sequentially applied, such that the application of each read threshold voltage yields a raw read data value associated with each memory cell that is read. Consequently, for read threshold voltages $V_T(1)$, $V_T(2)$, $V_T(3)$, $V_T(4)$, $V_T(5)$, five separate raw read data values are obtained for each memory location. Those skilled in the art will appreciate that any number of two or more read threshold voltages can be used in various implementations, and that the five read threshold voltages described with reference FIG. 3 are provided as an illustrative example.

More generally, the sequence of raw read data values obtained from a memory cell is an N-bit binary sequence, generated by a sequence of N read operations. As described in more detail below, in some implementations, the read threshold voltages used in the sequence of N read operations is a monotonically increasing or decreasing sequence of read threshold voltages. In some implementations, the monotonically increasing or decreasing sequence of read threshold voltages are applied non-sequentially and the resulting raw data values are re-ordered so that the resulting raw data values are thus arranged as though the read threshold voltages had been applied sequentially.

Based on an N-bit binary sequence, in some embodiments, a soft information value (e.g., an LLR) is generated by mapping the N-bit binary sequence to an LLR using a lookup table (LUT) (e.g., LLR Table 212, FIG. 2). As an example, in the following discussion, assume an N-bit binary sequence is produced by a sequence of read operations using the sequence of read threshold voltages [$V_T(1)$, $V_T(2)$, $V_T(3)$, $V_T(4)$, $V_T(5)$]. The N-bit binary sequences map to LLRs as follows:

the N-bit binary sequence [1, 1, 1, 1, 1] maps to a soft information value representing a high probability of a "1" (e.g., LLR Value 212-1, FIG. 2, which holds a value of +100), thus the data value is believed to be a "1";

the N-bit binary sequence [0, 1, 1, 1, 1] maps to a soft information value representing a lesser probability of a "1" (e.g., LLR Value 212-2, FIG. 2, which holds a value of +1), thus the data value is believed to be a "1";

the N-bit binary sequence [0, 0, 1, 1, 1] maps to a soft information value representing a weak probability of a "1" (e.g., LLR Value 212-3, FIG. 2, which holds a value of +0.5), thus the data value is believed to be a "1";

the N-bit binary sequence [0, 0, 0, 1, 1] maps to a soft information value representing a weak probability of a "0" (e.g., LLR Value 212-4, FIG. 2, which holds a value of −0.5), thus the data value is believed to be a "0";

the N-bit binary sequence [0, 0, 0, 0, 1] maps to a soft information value representing a greater probability of a "0" (e.g., LLR Value 212-5, FIG. 2, which holds a value of −1), thus the data value is believed to be a "0"; and the N-bit binary sequence [0, 0, 0, 0, 0] maps to a soft information value representing a high probability of a "0" (e.g., LLR Value 212-6, FIG. 2, which holds a value of −100), thus the data value is believed to be a "0."

The description above is just one way to calculate a soft information value (e.g., an LLR) for a data value at a location in memory. In accordance with a variety of embodiments, other methods for calculating a soft information value (e.g., an initial or pre-update soft information value) take into account various read parameters and/or other parameters (e.g., temperature, location, and/or history of the memory cell). In some embodiments, soft information values are calculated in a different manner entirely.

Figure 4:
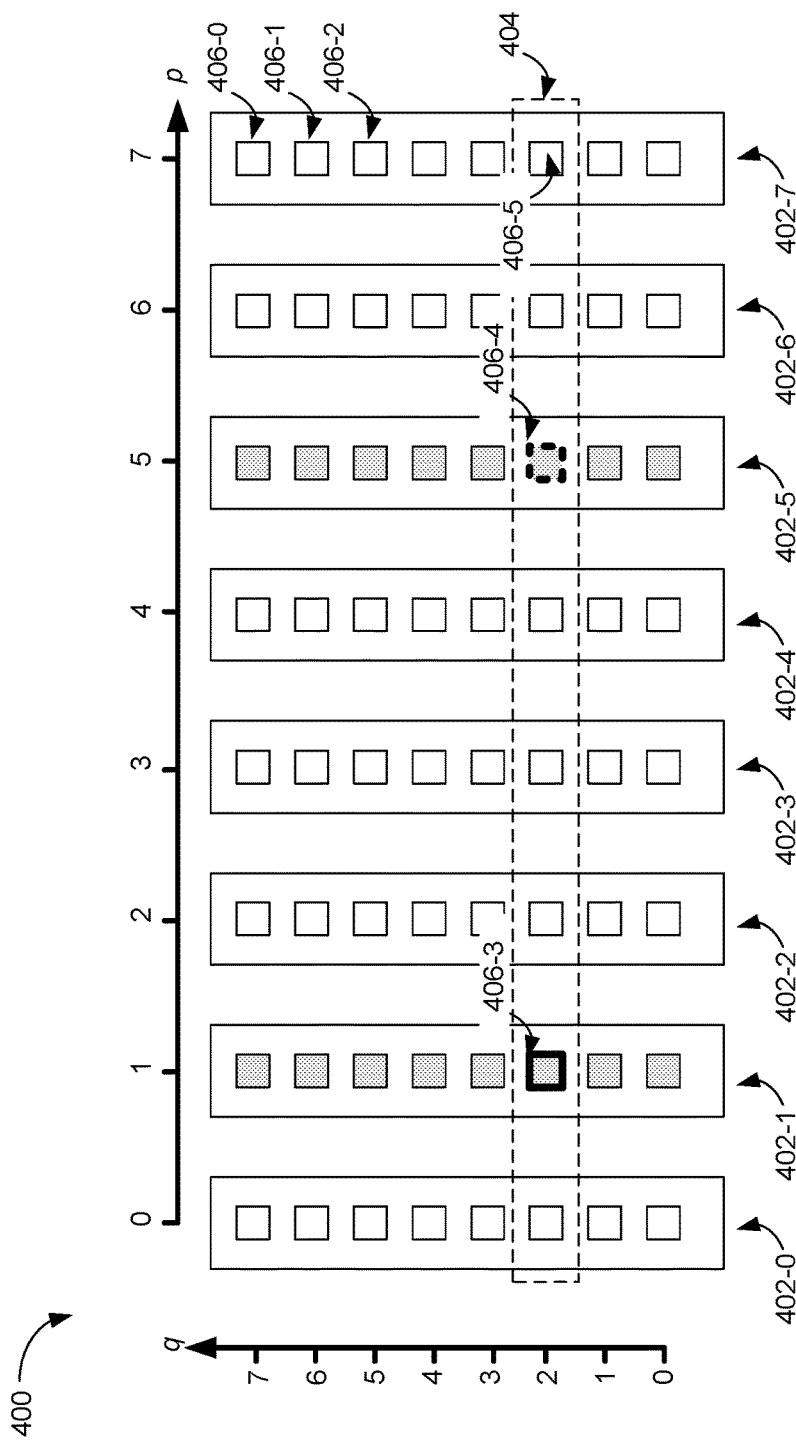
FIG. 4 illustrates memory organized by units of memory and error correction stripes, in accordance with some embodiments.
Figure 5B:
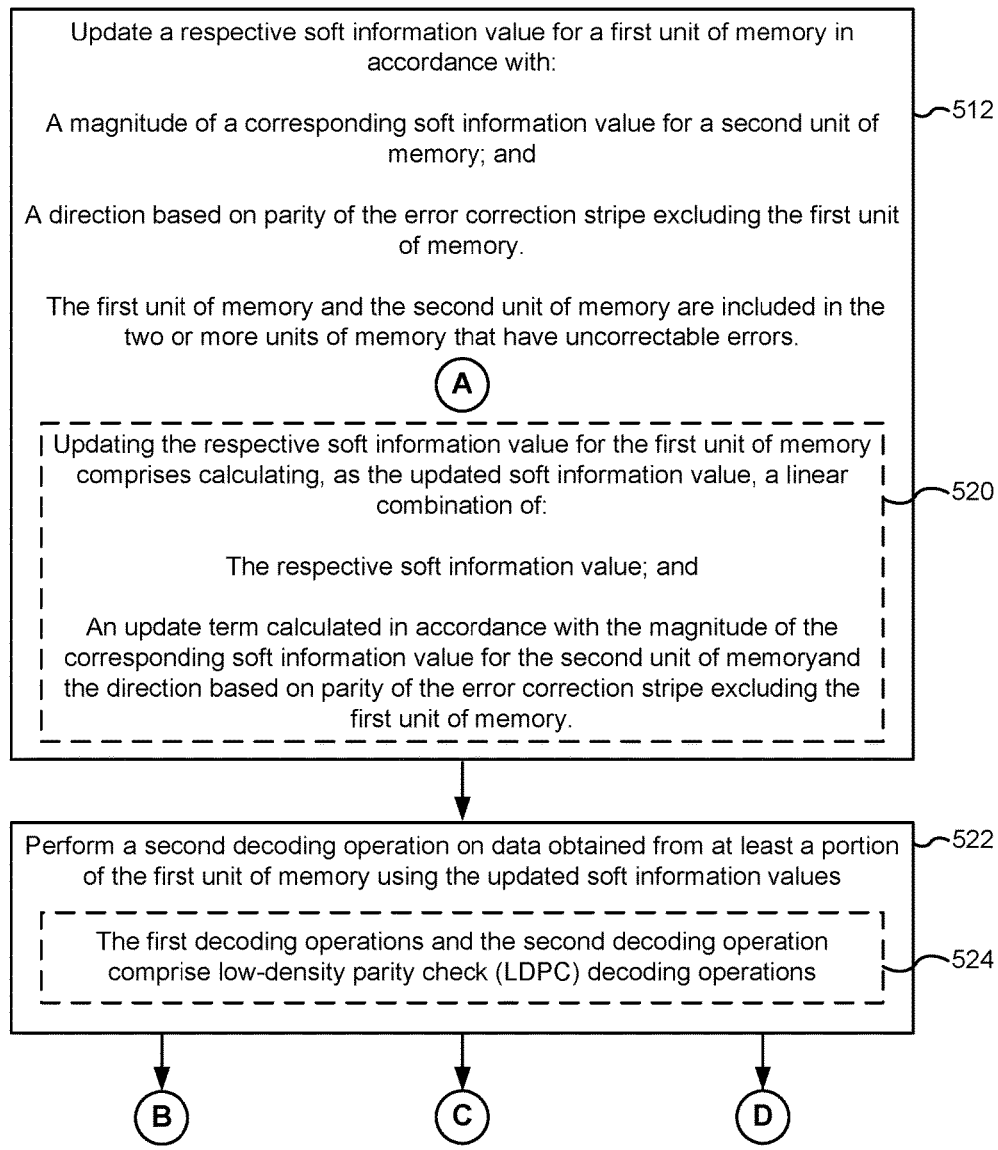
Figure 5C:
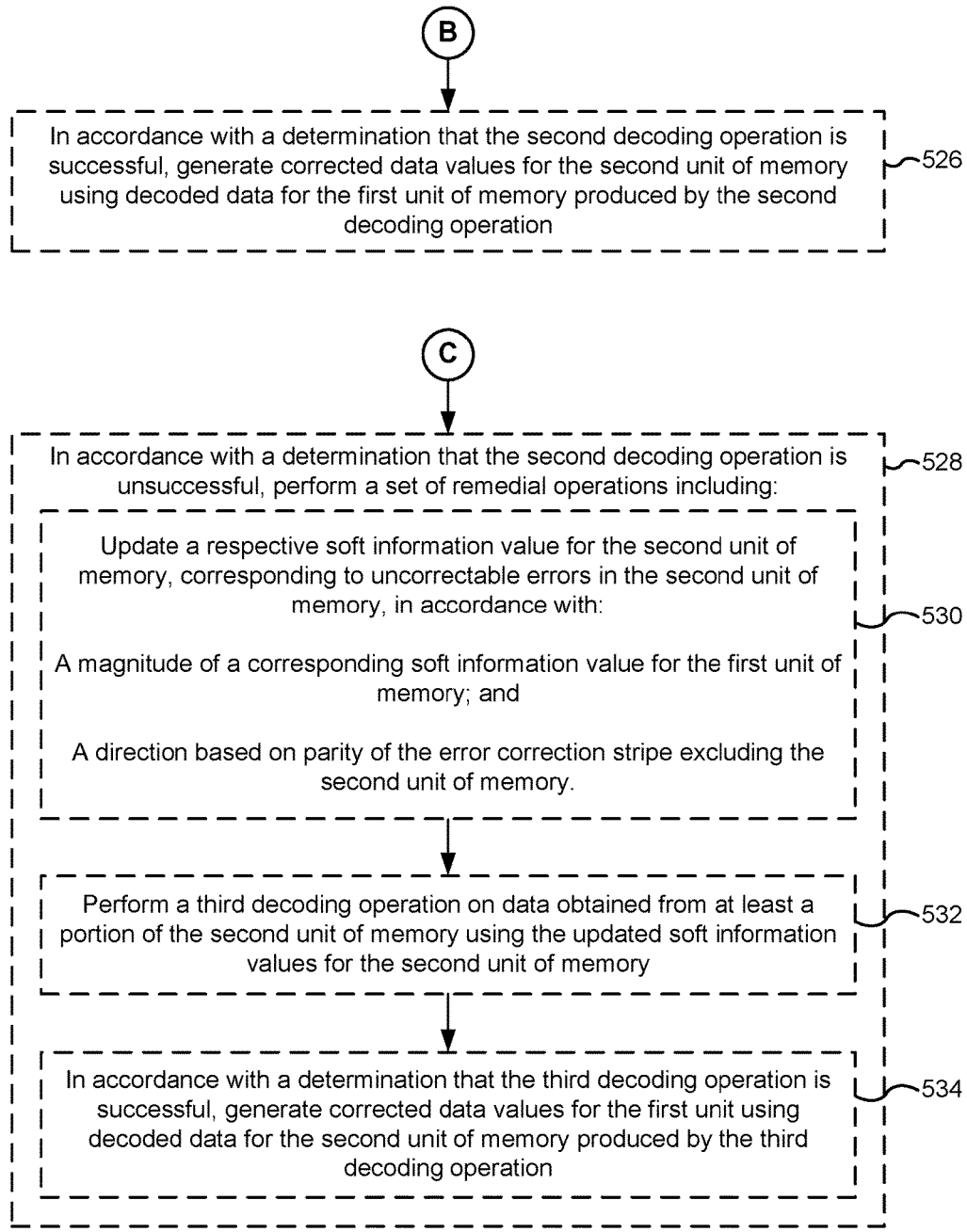
Figure 5D:
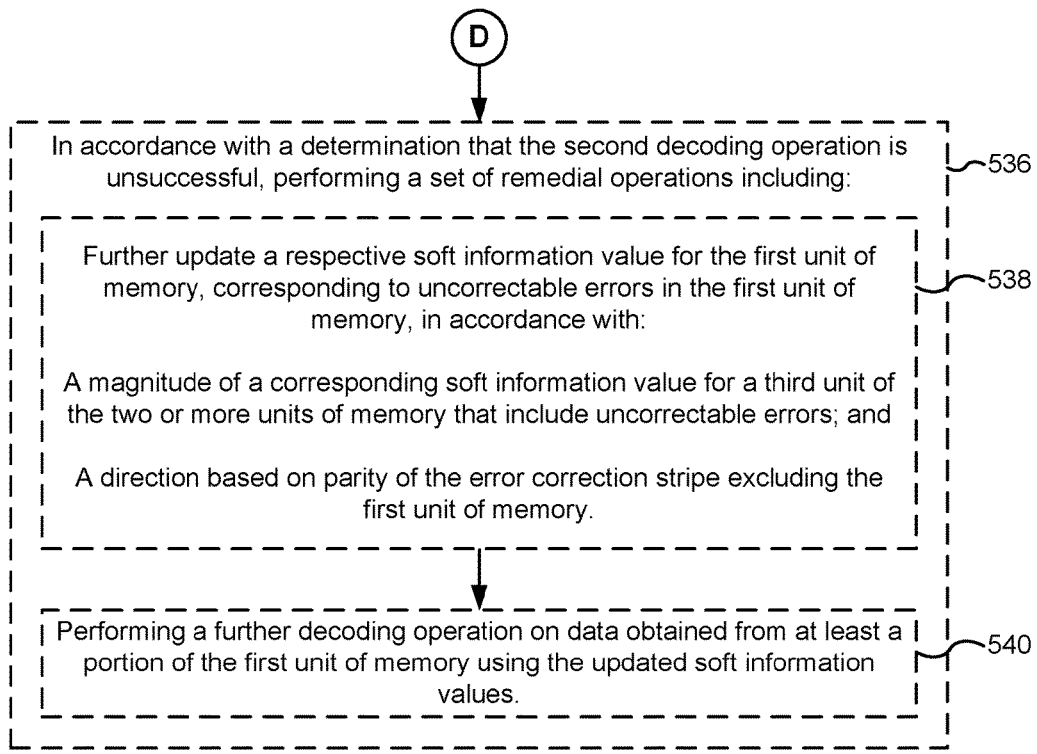

FIG. 4 illustrates memory 400 organized by units of memory and error correction stripes, in accordance with some embodiments. Memory 400 is organized into a plurality of units of memory 402 (e.g., unit of memory 402-0 through unit of memory 402-7). In various embodiments, the units of memory comprise partial pages, pages, codewords, partial codewords, blocks, or die planes. For ease of explanation, the following discussion assumes that the units of memory are codewords, and thus units of memory 402 are referred to hereinafter as codewords 402. Codewords 402 each comprise a plurality of bits 406 (e.g., codeword 402-7 includes bit 406-0 through bit 406-2 among others, codeword 402-1 includes bit 406-3 among others, and codeword 402-5 includes bit 406-4 among others).

The plurality of codewords 402 includes one or more error correction stripes. In a first view, the entire plurality of codewords 402 shown in FIG. 4 forms a single error correction stripe, in which a check word stored in codeword 402-7 (for example) is computed by XORing all the other codewords in the stripe (i.e., bitwise XORing the codewords). In this view, the bits at each bit index q across all the codewords in the strip form an error correction sub-stripe. In second view that is functionally equivalent to the first view, the bits at each bit index q across all the codewords 402 shown in FIG. 4 form an error correction stripe. For example, in this second view, the plurality of codewords 402 includes error correction stripe 404. In turn, error correction stripe 404 includes one bit from each codeword 402 in memory 400. In this example, codeword 402-7 is a parity codeword (sometimes called a check word) that stores a parity value for each of a plurality of error correction stripes. For example, in some embodiments, a parity value for error correction stripe 404 is calculated by XORing each of the other bits in error correction stripe 404 (i.e., besides bit 406-5). The parity value is then stored in bit 406-5. In this example, each bit in codeword 402-7 stores a parity value for an error correction stripe that is analogous to error correction stripe 404. These error correction stripes are omitted so as not to crowd the figure. Alternatively, in some embodiments, the check word is calculated before data is encoded, and then the check word is itself encoded and stored in codeword 402-7 as an encoded check word. Codewords 402 that store data values (i.e., rather than parity values) are sometimes referred to herein as "data elements."

In addition, FIG. 4 illustrates index axes p and q. The index axes are shown as a reference for ease of understanding the LLRs described with reference to method 500 (FIGS. 5A-5D). In particular, an LLR for the $q^{th}$ bit of the $p^{th}$ codeword is written in the description of method 500 as $LLR_{p,q}$.

Consider, as an example, a situation in which data in codeword 402-1 is requested. When the data request is received, memory controller 120 (FIG. 1) generates a sequence of soft information values, e.g., a sequence of LLRs:

$$y_{LLR}^{(402-1)} = (y_0^{(402-1)}, y_1^{(402-1)}, \ldots, y_7^{(402-1)}). \tag{1}$$

Each LLR in the sequence of LLRs $y_{LLR}^{(402-1)}$ corresponds to a bit in codeword 402-1 and is generated as described with reference to FIG. 3. The sequence of LLRs $y_{LLR}^{(402-1)}$ is made available to decoder 127 (FIG. 1). Decoder 127 attempts to decode the sequence of LLRs $y_{LLR}^{(402-1)}$ using a primary decoding (described in more detail below), such as LDPC. As illustrated in FIG. 4, the bits of codeword 402-1 are shown in gray to illustrate an example in which primary decoding of codeword 402-1 has failed. In such circumstances, decoder 127 attempts to decode the remainder of the codewords 402 in order to recover codeword 402-1 using a remedial decoding, such as RAID. But when, for example, codeword 402-5 also fails to decode (and hence is also shown with gray bits), decoder 127 is faced with a situation where two or more of the plurality of codewords have uncorrectable errors, and thus RAID is not feasible without additional remedial operations.

As described below, method 500 provides a manner in which to update a soft information value for bit 406-3 using the corresponding soft information value for bit 406-4 and a parity of the remaining bits in error correction stripe 404. (Bit 406-3 is shown with a heavy solid line to indicate that its LLR is being updated while bit 406-4 is shown with a heavy dashed line to indicate that its LLR is being used to update the LLR for bit 406-3.)

FIGS. 5A-5D illustrate a flowchart of a method 500 of updating soft information values for decoding data, in accordance with some embodiments. In some embodiments, various operations in method 500 are performed at a memory device (e.g., storage medium 130 in data storage system 100, FIG. 1). In some embodiments, various operations in method 500 are performed at a memory controller 120 coupled to a storage medium 130. Some operations in method 500 are, optionally, combined and/or the order of some operations is, optionally, changed. For ease of explanation, embodiments described with reference to method 500 are described with reference to a single data storage system 100 ("the device" or "the data storage device") having a memory controller. The data storage system optionally includes specialized processors or modules to, for example, perform mathematical operations, such as the mathematical operations for encoding and decoding data using a primary encoding/decoding (e.g., BCH or LDPC), and/or for encoding and recovery of data using a remedial encoding/decoding (e.g., XOR). In the following, an LDPC encoded codeword is used as an example to illustrate the principles of the embodiments of the present disclosure.

Data is often stored in an encoded form within a unit of memory. For example, in some circumstances, an LDPC encoded codeword is stored as a sequence of bits along a word line in memory (e.g., in storage medium 130). When a data request is received for data in the codeword, a sequence of soft information values is generated for the codeword (e.g., as described with reference to FIG. 3 and FIG. 4). The device then attempts to decode the codeword using the sequence of soft information values.

More particularly, the operation of reading from memory generally includes reading a voltage on a memory cell storing one or more bits (e.g., by comparing it to one or more read threshold voltages). From such voltages, the soft information values are generated (e.g., by mapping the results to an LLR stored in a lookup table). In some embodiments, other parameters of the read operation, including temperature and/or the physical location of the data in memory, are used to modify and/or determine the soft information values as well. One of ordinary skill in the art will appreciate the various ways to generate soft information values. As such, an exhaustive discussion of these techniques is not provided herein.

Using the sequence of soft information values for an LDPC encoded codeword, a memory controller attempts to decode the LDPC encoded codeword. This is possible within certain limits on the amount of error in the set of soft information values, beyond which the codeword is said to be uncorrectable (e.g., unrecoverable) using the primary decoding (e.g., LDPC). When a codeword is uncorrectable using primary decoding, in some embodiments, the memory controller attempts to perform a remedial decoding (e.g., by XORing other data, typically other codewords, stored a RAID stripe). Such remedial decoding often involves decoding additional codewords. For example, the memory controller will attempt to decode all of the codewords included in an error correction stripe (e.g., a RAID stripe). When the remaining codewords are successfully decoded, the uncorrectable codeword is recoverable using the remedial decoding (e.g., by XORing the remaining codewords together). But when one or more of the additional codewords in the error correction stripe are uncorrectable, the remedial decoding may be unavailable as well.

As described below, the method 500 provides a way to update soft information values, e.g., used by a primary decoding scheme (e.g., LDPC), in order to give the memory controller another opportunity to decode an uncorrectable codeword using the primary decoding. The method can recover data that would otherwise be lost due to a large number of errors, e.g., random retention errors associated with a storage medium having one or more die nearing the end of their useful life. Further, following successful decoding of a codeword using the primary decoding with updated soft information values, the method can be bootstrapped and/or combined with a remedial decoding (e.g., RAID) to recover remaining codewords in the error correction stripe.

The device performs (502) first decoding operations (e.g., using the primary decoding) on data obtained from a plurality of units of memory using soft information values for the plurality of units of memory. The plurality of units of memory includes an error correction stripe (e.g., a RAID stripe and/or error correction stripe 404, FIG. 4). In some embodiments, an attempt to decode a single codeword is considered a single decoding operation, and hence the term "first decoding operations" signifies that more than one attempt to decode a codeword is performed in operation 502 (e.g., an attempt to decode the same codeword more than once and/or an attempt to decode more than one codeword). Additional details about the first decoding operations are discussed with reference to operation 510 below.

In some embodiments, the units of memory comprise (504) one of partial pages, pages, codewords, partial codewords, blocks, and die planes. In some embodiments, the units of memory comprise (506) non-volatile memory. In some embodiments, the units of memory comprise (508) flash memory.

The device determines (510) that two or more of the plurality of units of memory have (e.g., store data with) uncorrectable errors. The uncorrectable errors are uncorrectable using the first decoding operations. For example, data element 402-1 and data element 402-2 (FIG. 4) are uncorrectable using LDPC decoding. Using the data element shown in FIG. 4 as an example, in some embodiments, the process of determining that two or more of the plurality of units of memory have uncorrectable errors proceeds as follows: the device receives a request (e.g., from host computer 109, FIG. 1) for data stored in data element 402-1. The data request may include requests for additional data, but for the purposes of explanation, the request is described with reference to only data element 402-1. The device then attempts to decode the data stored in data element 402-1. If the attempt to decode the data stored in data element 402-1 is successful, the data is returned (e.g., to the host computer 109, FIG. 1) and no further action is required. But if the attempt to decode the data stored in data element 402-1 is unsuccessful, the device attempts to decode the remainder of codewords having bits contributing to the error correction stripe (e.g., the other data elements and/or check words stored in the plurality of units of memory) in order to utilize a remedial decoding (e.g., RAID). For RAID to be successful, in some circumstances, the remainder of the data in the error correction stripe has to be successfully decoded. When the remainder of the data in the error correction stripe includes additional uncorrectable errors (e.g., uncorrectable using a primary decoding method), the device determines (per operation 514) that two or more of the plurality of units of memory have uncorrectable errors.

In accordance with the determination that two or more units of memory have uncorrectable errors, the device updates (512) a respective soft information value for a first unit of memory in accordance with: (1) a magnitude of a corresponding soft information value for a second unit and (2) a direction (e.g., sign) based on parity of the error correction stripe excluding the first unit, where the first unit of memory and the second unit of memory are included in the two or more units of memory that have uncorrectable errors.

In some embodiments, the error correction stripe includes (514) a parity unit that stores one or more parity values based on at least data in the first unit and the second unit. In some embodiments, the error correction stripe includes a portion of the parity unit (e.g., a single bit). In some embodiments, the error correction stripe is (516) a RAID stripe (a parity unit is a unit of memory that stores a check word rather than data). For example, parity unit 402-7 (FIG. 4) includes parity bit 406-5. Parity bit 406-5 holds a respective parity value within a check word that is based in part on data bit 406-3 and data bit 406-4. More specifically, the parity value is the result of an XOR operation on all of the data bits in error correction stripe 404 (i.e., excluding the parity bit).

In some embodiments, the soft information values comprise (518) log-likelihood ratios (LLRs).

In some embodiments, updating the respective soft information value for the first unit includes (520) calculating, as the updated soft information value, a linear combination of: (1) the respective soft information value (i.e., a pre-update value of the respective soft information value), and (2) an update term calculated in accordance with the magnitude of the corresponding soft information value for the second unit and the direction (e.g., sign) based on parity of the error correction stripe excluding the first unit.

In some embodiments, the respective soft information value for a first unit of memory is a soft information value for an $i^{th}$ bit of data stored in the first unit of memory. The device updates the respective soft information value for a first unit of memory in accordance with the following equation:

$$LLR'_{j,i} = LLR_{j,i} + \alpha \times \min_{m \in \epsilon, m \neq j} |LLR_{m,i}| \times \prod_{k=0, k \neq j}^{N-1} \text{sgn}(LLR_{k,i}), \quad (2)$$

where j is an index of the first unit of memory, $\epsilon$ is the set of two or more of the plurality of units of memory having uncorrectable errors, and N is the number of units of memory contributing to the error correction stripe. Terms written in the form $LLR_{p,q}$ refer to an LLR value for the $q^{th}$ bit of the $p^{th}$ unit of memory (see FIG. 4). More specifically, $LLR'_{j,i}$ refers to a post-update soft information value for the $i^{th}$ bit of data stored in the first unit of memory, while $LLR_{j,i}$ refers to a pre-update soft information value for the $i^{th}$ bit of data stored in the first unit of memory. In this sense, Equation (2) is an update equation for the $i^{th}$ bit of data stored in the first unit of memory. The direction (e.g., sign) of the update term is set by the product of signum functions (Term (3), described below). The product has a magnitude of unity and a sign that reflects the parity of the error correction stripe excluding the first unit. To that end, the index k of the product term runs from zero to N−1 while skipping j=k. Likewise, the term $\min_{m \in \epsilon, m \neq j} |LLR_{m,i}|$ selects the minimum LLR in the error correction stripe, excluding the first unit of memory, while only considering LLRs for units of memory that are uncorrectable. The magnitude of the minimum LLR sets the magnitude of the update term together with a constant $\alpha$. In some embodiments, the constant $\alpha$ has a value equal or nearly equal to 0.9.

In some circumstances, an LLR represents, for a given bit, the value that the bit is believed to store as well as a confidence that the value is correct. More specifically, the sign of an LLR indicates whether the corresponding bit is believed to represent a 1 or a 0. For example, in some embodiments, when a bit has a positive LLR, the bit is likely to represent a value of 1 and, when a bit has a negative LLR, the bit is likely to represent a value of 0. The magnitude of the LLR represents the degree of certainty that the corresponding bit represents a value of 1 or a value of 0. For example, in some embodiments, an LLR of +100 represents a strong likelihood that a bit represents a value of 1, while an LLR of 0.5 represents a bit that is thought to represent a value of 1, but with far less certainty. Likewise, an LLR of −100 represents a strong likelihood that a bit represents a value of 0, while an LLR of −0.5 represents a bit that is thought to represent a value of 0, but with far less certainty.

There is, however, another way to determine the value of a bit. Moreover, the two ways of determining the value of a bit will either agree or disagree. Method 500 updates the LLRs to increase its certainty when the two ways agree and updates the LLR to decrease its certainty (or even flip a bit) when the two ways disagree. The second way to determine the value of a bit is as follows: when the plurality of units of memory comprises an error correction stripe (see operation 514), in some embodiments, the value of the bit can be determined by using the remedial decoding on (e.g., XOR-ing) all of the other bits stored in the error correction stripe. This is referred to herein as the parity of the error correction stripe excluding the first unit and is represented in Equation (2) by the term:

$$\prod_{k=0, k \neq j}^{N-1} \text{sgn}(LLR_{k,i}). \quad (3)$$

When the two ways of calculating a bit's value agree (e.g., Term (3) produces the same sign as that of $LLR_{j,i}$ in Equation (2)), Term (3) represents a positive reassurance that the sign of $LLR_{j,i}$ is correct. In this case, Equation (2) "pushes" $LLR_{j,i}$ in the direction of further confidence (i.e., more negative or more positive). When the two ways of calculating a bit's value disagree (e.g., Term (3) produces the opposite sign as that of $LLR_{j,i}$ in Equation (2)), Equation (2) pushes $LLR_{j,i}$ in the direction of reduced confidence (i.e., less negative or less positive) or even switches the sign of $LLR_{j,i}$, depending on the magnitude of $LLR_{j,i}$ and the magnitude of the update discussed below.

Because the accuracy of the parity (i.e., the parity of the error correction strip excluding the first unit of memory) is related to the LLRs in the error correction stripe excluding the first unit, the minimum corresponding LLR from a codeword with an uncorrectable error in the error correction stripe is chosen to represent a magnitude (or confidence) of the update. This magnitude (or confidence) is represented Equation (2) by:

$$\min_{m \in \epsilon, m \neq j} |LLR_{m,i}|. \quad (4)$$

The constant $\alpha$ is used to optimize method 500.

In some circumstances, there are only two units of memory in the error correction stripe that have uncorrectable errors, in which case Equation (2) can be written in a simplified form:

$$LLR'_{1,i} = LLR_{1,i} + \alpha \times |LLR_{2,i}| \times \prod_{k=0, k \ne j}^{N-1} \text{sgn}(LLR_{k,i}), \quad (5)$$

where $LLR_{1,i}$ is an LLR for an $i^{th}$ bit of a first unit of memory, $\alpha$ is a constant that in some embodiments has a value equal or nearly equal to 0.9, and $LLR_{2,i}$ is an LLR for the $i^{th}$ bit of a second unit of memory. For example, as shown in FIG. 4, the uncorrectable errors are stored in data element 402-1 and data element 402-5. An LLR for bit 406-3 is updated using an LLR for bit 406-4 in accordance with Equation (5). This can be written specifically for the example in FIG. 4 as:

$$LLR'_{406-3} = LLR_{406-3} + \alpha \times |LLR_{406-4}| \times \prod_{\substack{k \in 404, \\ k \ne 406-3}} \text{sgn}(LLR_k). \quad (6)$$

In some embodiments, method 500 proceeds by updating some or all of the other LLRs in the first unit of memory in an analogous manner. Stated another way, in some embodiments, a plurality of the first unit's soft information values is updated. Further, each respective soft information value of the plurality of the first unit's soft information values is updated in accordance with a magnitude of a corresponding soft information value for another uncorrectable unit and a direction based on parity of the error correction stripe excluding the first unit.

After updating the respective soft information value (see operation 516), the device performs (522) a second decoding operation on data obtained from at least a portion of the first unit using the updated soft information value. In some embodiments, the second decoding operation is the same type of decoding operation as the first decoding operations (e.g., a primary decoding). In some embodiments, the first decoding operations and the second decoding operation comprise (524) low-density parity check (LDPC) decoding operations. For example, after updating one or more of the LLRs corresponding to bits in data element 402-1, the device again performs LDPC decoding on the data in data element 402-1.

Depending on the result of operation 522 (e.g., whether operation 522 is successful), several subsequent operations are contemplated, in accordance with a variety of embodiments. These subsequent operations are described below with reference to operations 526-540.

In some embodiments, in accordance with a determination that the second decoding operation is successful, the device generates (526) corrected data values for the second unit of memory using decoded data for the first unit produced by the second decoding operation. In some embodiments, the device generates corrected data values for the second unit of memory using remedial decoding (e.g., RAID). For example, assuming that data element 402-1 (FIG. 4) is correctly decoded during operation 522, in some embodiments, the device XORs the values in error correction stripe 404, excluding bit 406-4, to determine the value held by bit 406-4. In some embodiments, the device performs an analogous operation for a plurality of error correction stripes to fully recover data stored in data element 402-5. Optionally, in some embodiments, once all data in the error correction stripe has been recovered in this manner, data for the entire error correction strip is rewritten to a new location in memory (e.g., to a new error correction stripe) and the "old copy" of the data in the error correction stripe is marked as invalid.

In accordance with a determination that the second decoding operation is unsuccessful, the device performs (528) a set of remedial operations. The set of remedial operations includes updating (530) a respective soft information value for the second unit of memory, corresponding to uncorrectable errors in the second unit, in accordance with a magnitude of a corresponding soft information value for the first unit and a direction based on parity of the error correction stripe excluding the second unit. Stated another way, when updating the first unit of memory's LLRs based on the second unit of memory's LLRs does not work, in some embodiments, the device tries updating the second unit of memory's LLRs based on the first unit of memory's LLRs. For example, assuming that data element 402-1 (FIG. 4) is not correctly decoded during operation 522, in some embodiments, the device updates the LLR for data element 406-4 based on the LLR for data element 406-3, e.g., in accordance with the equation:

$$LLR'_{406-4} = LLR_{406-4} + \alpha \times |LLR_{406-3}| \times \prod_{\substack{k \in 404, \\ k \ne 406-4}} \text{sgn}(LLR_k). \quad (7)$$

In some embodiments, method 500 proceeds by updating some or all of the other LLRs in the second unit of memory in an analogous manner. Stated another way, in some embodiments, a plurality of the second unit's soft information values is updated. Further, each respective soft information value of the plurality of the second unit's soft information values is updated in accordance with a magnitude of a corresponding soft information value for another uncorrectable unit and a direction based on parity of the error correction stripe excluding the second unit. The device then performs (532) a further (third) decoding operation on data obtained from at least a portion of the second unit of memory using the updated soft information values for the second unit of memory. In some embodiments, in accordance with a determination that the third decoding operation is successful, i.e., successfully decoding the data in the second unit of memory, the device generates (534) corrected data values for the first unit of memory using decoded data for the second unit of memory produced by the third decoding operation. In some embodiments, the device generates corrected data values for the first unit of memory using remedial decoding (e.g., RAID).

In some embodiments, in accordance with a determination that the second decoding operation is unsuccessful, the device performs (538) a set of remedial operations. The set of remedial operations includes further updating the first unit's soft information values, corresponding to uncorrectable errors in the first unit, in accordance with a magnitude of a corresponding soft information value for a third unit of the two or more units of memory that include uncorrectable errors and a direction based on parity of the error correction stripe excluding the first unit. Stated another way, when there are at least three uncorrectable errors, the device tries to update the respective soft information value again, this time using a magnitude of an LLR other than the LLR determined in Term (4), described above. The device then performs (540) a further decoding operation on data obtained from at least a portion of the first unit using the updated soft information values.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method performed by a storage device, the method comprising:
    at the storage device:
        receiving one or more read requests from a host system, the one or more read requests specifying data stored in a plurality of units of memory;
        obtaining data from the plurality of units of memory in accordance with the one or more read requests;
        performing first decoding operations on the data obtained from the plurality of units of memory using soft information values for the plurality of units of memory, wherein the plurality of units of memory includes an error correction stripe;
        determining that two or more of the plurality of units of memory have uncorrectable errors, wherein the uncorrectable errors are uncorrectable using the first decoding operations;
        updating a respective soft information value for a first unit of memory in accordance with:
            a magnitude of a corresponding soft information value for a second unit of memory; and
            a direction based on parity of the error correction stripe excluding the first unit of memory, wherein the first unit of memory and the second unit of memory are included in the two or more units of memory that have uncorrectable errors;
        performing a second decoding operation on data obtained from at least a portion of the first unit of memory using the updated soft information value;
        in accordance with a determination that the second decoding operation is successful, providing decoded data from the second decoding operation to a memory controller; and
        in accordance with a determination that the second decoding operation is unsuccessful, performing a set of remedial operations or providing an indication of an irresolvable error condition to a memory controller.

2. The method of claim 1, further including:
    in accordance with the determination that the second decoding operation is successful, generating corrected data values for the second unit using decoded data for the first unit of memory produced by the second decoding operation.

3. The method of claim 1, wherein the set of remedial operations includes:
    updating a respective soft information value for the second unit of memory, corresponding to uncorrectable errors in the second unit of memory, in accordance with:
        a magnitude of a corresponding soft information value for the first unit of memory; and
        a direction based on parity of the error correction stripe excluding the second unit of memory; and
    performing a third decoding operation on data obtained from at least a portion of the second unit using the updated soft information value for the second unit of memory; and
    in accordance with a determination that the third decoding operation is successful, generating corrected data values for the first unit of memory using decoded data for the second unit of memory produced by the third decoding operation.

4. The method of claim 1, wherein the set of remedial operations includes:
    further updating a respective soft information value for the first unit of memory, corresponding to uncorrectable errors in the first unit of memory, in accordance with:
        a magnitude of a corresponding soft information value for a third unit of the two or more units of memory that include uncorrectable errors; and
        a direction based on parity of the error correction stripe excluding the first unit of memory; and
    performing a further decoding operation on data obtained from at least a portion of the first unit of memory using the updated soft information value.

5. The method of claim 1, wherein the error correction stripe includes a parity unit that stores one or more parity values based on at least data in the first unit and the second unit.

6. The method of claim 5, wherein the error correction stripe is a RAID stripe.

7. The method of claim 1, wherein the soft information values comprise log-likelihood ratios (LLRs).

8. The method of claim 1, wherein the units of memory comprise one of partial pages, pages, codewords, partial codewords, blocks, and die planes.

9. The method of claim 1, wherein the units of memory comprise non-volatile memory.

10. The method of claim 1, wherein the units of memory comprise flash memory.

11. The method of claim 1, wherein the first decoding operations and the second decoding operation comprise low-density parity check (LDPC) decoding operations.

12. The method of claim 1, wherein updating the respective soft information value for the first unit of memory comprises calculating, as the updated soft information value, a linear combination of:
the respective soft information value; and
an update term calculated in accordance with the magnitude of the corresponding soft information value for the second unit of memory and the direction based on parity of the error correction stripe excluding the first unit of memory.

13. A storage device, comprising:
non-volatile memory;
one or more processors;
a decoder for decoding data obtained from the non-volatile memory, including first decoding operations on data obtained from a plurality of units of the non-volatile memory using soft information values for the plurality of units of the non-volatile memory, wherein the plurality of units of the non-volatile memory includes an error correction stripe; and
controller memory storing one or more programs, which when executed by the one or more processors cause the storage device to perform operations comprising:
determining that two or more of the plurality of units of the non-volatile memory have uncorrectable errors, wherein the uncorrectable errors are uncorrectable using the first decoding operations;
updating a respective soft information value for a first unit of memory in accordance with:
a magnitude of a corresponding soft information value for a second unit of memory; and
a direction based on parity of the error correction stripe excluding the first unit of memory, wherein the first unit of memory and the second unit of memory are included in the two or more units of memory that have uncorrectable errors; and
wherein the decoder is further for a second decoding operation on data obtained from at least a portion of the first unit of memory using the updated soft information value; and
in accordance with a determination that the second decoding operation is successful, the decoder is further for providing decoded data from the second decoding operation to a memory controller; and
in accordance with a determination that the second decoding operation is unsuccessful, the decoder is further for performing a set of remedial operations or providing an indication of an irresolvable error condition to a memory controller.

14. The storage device of claim 13, wherein the memory controller includes the one or more processors and controller memory, and wherein the memory controller includes a soft information adjustment module that adjusts soft information values of respective units of the non-volatile memory.

15. The storage device of claim 13, wherein, in accordance with the determination that decoding data obtained from at least a portion of the first unit of memory using the updated soft information value is successful, the one or more processors cause the storage device to generate corrected data values for the second unit using decoded data for the first unit of memory produced by the second decoding operation.

16. The storage device of claim 13, wherein the set of remedial operations includes:
updating a respective soft information value for the second unit of memory, corresponding to uncorrectable errors in the second unit of memory, in accordance with:
a magnitude of a corresponding soft information value for the first unit of memory; and
a direction based on parity of the error correction stripe excluding the second unit of memory; and
performing a third decoding operation on data obtained from at least a portion of the second unit using the updated soft information value for the second unit of memory; and
in accordance with a determination that the third decoding operation is successful, generating corrected data values for the first unit of memory using decoded data for the second unit of memory produced by the third decoding operation.

17. The storage device of claim 13, wherein the error correction stripe includes a parity unit that stores one or more parity values based on at least data in the first unit and the second unit.

18. The storage device of claim 17, wherein the error correction stripe is a RAID stripe.

19. The storage device of claim 13, wherein the soft information values comprise log-likelihood ratios (LLRs).

20. The storage device of claim 13, wherein updating the respective soft information value for the first unit of memory comprises calculating, as the updated soft information value, a linear combination of:
the respective soft information value; and
an update term calculated in accordance with the magnitude of the corresponding soft information value for the second unit of memory and the direction based on parity of the error correction stripe excluding the first unit of memory.

21. A non-transitory computer readable storage medium, storing one or more programs configured for execution by one or more processors of a storage system, the one or more programs including instructions for:
at a storage device:
performing first decoding operations on a plurality of units of memory using soft information values for the plurality of units of memory, wherein the plurality of units of memory includes an error correction stripe;
determining that two or more of the plurality of units of memory have uncorrectable errors, wherein the uncorrectable errors are uncorrectable using the first decoding operations;
updating a respective soft information value for a first unit of memory in accordance with:
a magnitude of a corresponding soft information value for a second unit of memory; and
a direction based on parity of the error correction stripe excluding the first unit of memory, wherein the first unit of memory and the second unit of memory are included in the two or more units of memory that have uncorrectable errors;
performing a second decoding operation on data obtained from at least a portion of the first unit of memory using the updated soft information value;
in accordance with a determination that the second decoding operation is successful, providing decoded data from the second decoding operation to a memory controller; and
in accordance with a determination that the second decoding operation is unsuccessful, performing a set of remedial operations or providing an indication of an irresolvable error condition to a memory controller.

* * * * *